United States Patent [19]

Hennins et al.

[11] Patent Number: 5,440,125
[45] Date of Patent: Aug. 8, 1995

[54] RADIATION DETECTOR HAVING A PYROELECTRIC CERAMIC DETECTION ELEMENT

[75] Inventors: Detlev Hennins; Joseph Pankert, both of Aachen, Germany

[73] Assignee: U.S. Philips Corporation, New York, N.Y.

[21] Appl. No.: 264,229

[22] Filed: Jun. 23, 1994

Related U.S. Application Data

[63] Continuation of Ser. No. 882,330, May 13, 1992, abandoned.

[30] Foreign Application Priority Data

May 16, 1991 [DE] Germany ............ 41 15 949.7

[51] Int. Cl.$^6$ ............................................. G01J 5/00
[52] U.S. Cl. ........................ 250/338.1; 250/338.3; 501/134
[58] Field of Search ............ 250/338.1, 338.3, 338.2; 501/134, 152; 252/629

[56] References Cited

U.S. PATENT DOCUMENTS

| | | | |
|---|---|---|---|
| 4,973,843 | 11/1990 | Murata et al. | 250/338.3 |
| 5,139,689 | 8/1992 | Kitoh et al. | 501/134 |
| 5,286,975 | 2/1994 | Ogura et al. | 250/383.3 |
| 5,293,041 | 3/1994 | Kruse, Jr. | 250/338.3 |

FOREIGN PATENT DOCUMENTS

| | | |
|---|---|---|
| 2283862 | 12/1987 | Japan. |
| 3060463 | 3/1991 | Japan. |
| 1504283 | 3/1978 | United Kingdom. |

OTHER PUBLICATIONS

American Soc. Bulletin Nr. 4, Apr. 1987 "Anisotropy in Piezoelectric Properties of Modified Lead Titanate Ceramics" pp. 699–703 D. Damjanovic et al.

Journal of Materials Science "Large Electromechanical Anisotropic Modified Lead Titanate Ceramics" Duran et al., pp. 4463–4469, 1988 no month.

Journal of Materials Science Letters, Aug. 1991 "Effect of MnO Additions on the Sintering and Piezoelectric Properties of Samarium-Modified Lead Titanate Ceramics" Duran et al. pp. 917–919.

Primary Examiner—Deborah Jones
Attorney, Agent, or Firm—Ernestine C. Bartlett

[57] ABSTRACT

A radiation detector having a radiation detection element of a pyroelectric ceramic material on the basis of lead titanate, the composition of which corresponds to the formula $Pb_{1-(x+0.5(x-y))}RE_x(Ti_{1-y}Mn_y)O_3$, where RE is at least one rare earth metal and $0.04 \leq x \leq 0.20$ and $0.01 \leq y \leq 0.04$. The element is disposed within a windowed housing.

6 Claims, 1 Drawing Sheet

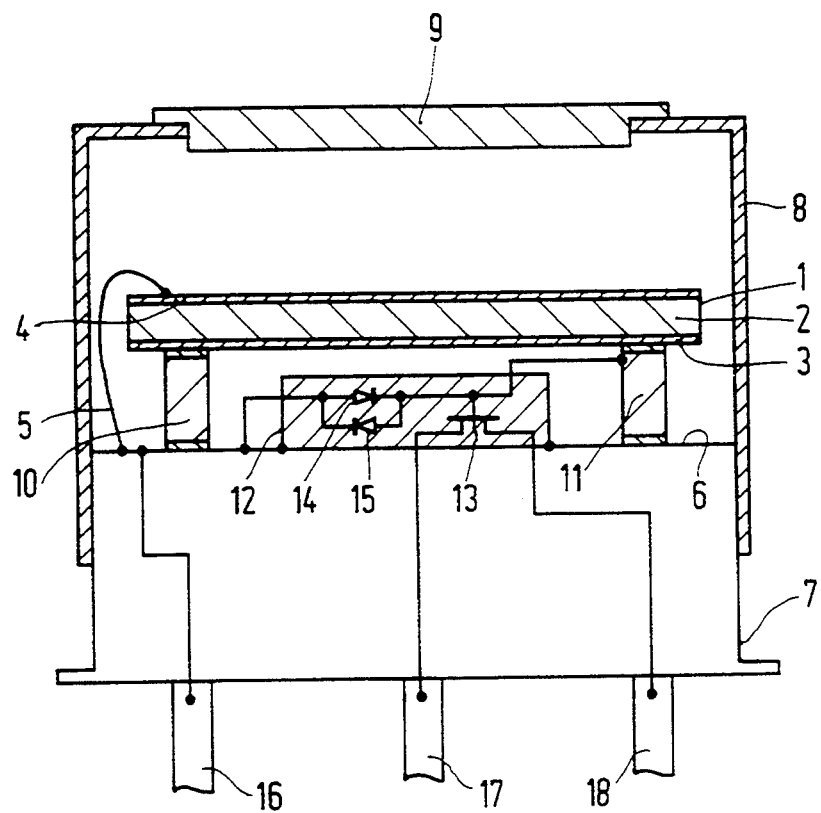

RADIATION DETECTOR HAVING A PYROELECTRIC CERAMIC DETECTION ELEMENT

This is a continuation of application Ser. No. 07/882,330, filed May 13, 1992, now abandoned.

BACKGROUND OF THE INVENTION

The invention relates to pyroelectric ceramic material on the basis of lead titanate, the use of this material in pyroelectric detectors for infrared radiation as well as pyroelectric detectors.

Pyroelectric detectors for infrared radiation can suitably be used to detect moving warm objects emitting thermal radiation in the wavelength range from 8 to 12 $\mu$m, which corresponds to a body temperature of approximately 300K. Pyroelectric detectors can typically be used, for example, in alarm systems or as replacements for light barriers.

Materials which can suitably be used for pyroelectric detectors should have a polarization which changes as much as possible with temperature. For example, crystals are known which are electrically charged in specific crystal faces as a result of a change in temperature. Pyroelectric crystals are built up of ordered polar atom groups having an accumulative effect and leading to a polarization P of the crystal. As a result thereof, the boundary surfaces of the crystal carry polarization charges. A change in the temperature of the crystal causes the polarization charges at the boundary surfaces of the crystal to change too because the polarization P is governed by temperature. This polarization charge formed by a change in temperature is termed pyroelectricity. Small charges released by a change in temperature can produce an electronic signal after they have been properly amplified.

The most important parameter for the effectiveness of pyroelectric material is the pyroelectric coefficient (p), i.e. the change of the ferroelectric polarization (P) per degree Kelvin (T) in the desired temperature range:
$p = \delta P / \delta T$ (unit: $10^{-4} C/m^2 K$).

The change of the charge resulting from the pyroelectric effect is electronically detected as a change in voltage usually by means of a field effect transistor, at the pyroelectric layer according to the equation $U = Q/C$, where U is the pyroelectric voltage in Volt, Q is the charge in Coulomb and C is the capacitance of the pyroelectric layer.

To obtain the highest possible pyroelectric voltages, the capacitance C of the pyroelectric layer must be as small as possible, which at a given layer thickness d and a given surface A of ceramic material can only be attained through the smallest possible relative dielectric constant $\epsilon_r$ of the ceramic material, according to the equation:

$C = \epsilon_0 \times \epsilon_r \times A/d$.

A further important factor for the effectiveness of pyroelectric ceramic material is the so-called "Figure of Merit" ($F_M$);

$F_M \approx p/(\epsilon_r \times C_p)$, where $C_p$ is the thermal capacity.

As the thermal capacity of ceramic sintered bodies having a similar composition changes only little, similar materials are often alternatively evaluated by means of a simplified formula for the Figure of Merit:

$F'_M \approx p/\epsilon_r$.

Apart from exhibiting the highest possible values for $F'_M$, ceramics for pyroelectric detectors should, with a view to industrial scale manufacture, be suitable for the manufacture of surface mounted devices (SMD). To solder SMD components, they are passed through a wave solder bath and exposed to temperatures up to approximately 250° C. for a short time. The Curie point of the pyroelectric ceramic material must be correspondingly high to prevent the material from being thermally depolarized during soldering, i.e. it should have a Curie point $T_c$ which is above 250° C.

From GB-PS 1 504 283 it is known to manufacture pyroelectric detectors from a material on the basis of lead zirconate titanate (PZT) which is doped with lanthanum and manganese. However, this material can not advantageously be used for pyroelectric detectors because its relative dielectric constant values of $\epsilon_r > 1700$ are too high. Moreover, PZT does not exhibit an optimum polarization behavior. Pyroelectric components on the basis of PZT are subject to substantial aging and, hence, do not exhibit a sufficiently high stability of the polarization P, which results in an insufficiently high reversibility of P.

In Electronic Ceramics 16 (1985), pp. 43 to 55, a pyroelectric ceramic material on the basis of a mixed crystal of lead timate (PT) with calcium titanate is disclosed, which corresponds to the formula $Pb_{0.8}Ca_{0.2}(Ti_{0.96}(Co_{0.5}W_{0.5})_{0.04})O_3$.

During sintering this material, a $Pb_2WO_5$-containing secondary phase is formed on the grain boundaries, which phase is used as a sintering auxiliary phase. A disadvantage of this composition is that tungsten is enriched in the secondary phase and, consequently, cobalt is enriched in the matrix. Since cobalt is an acceptor, a large number of oxygen vacancies are formed whose high mobility leads to ion conductivity. In thin films and at relatively high temperatures, however, ion conductivity may lead to degradation, which is undesirable for the functioning of the components.

Moreover, for reasons of practical use, it is desirable for pyroelectric detectors to exhibit a satisfactory microphonic stability. This is obtained when the ratio of the electromechanical coupling factors $k_p/k_t$ is as small as possible, i.e. <1, which ratio cannot be attained with the known materials for pyroelectric detectors such as, for example, materials on the basis of PZT.

SUMMARY OF THE INVENTION

It is an object of the invention to provide a pyroelectric ceramic material which, in view of the use of the material, does not only exhibit very favorable values for the pyroelectric coefficient p, the Curie point $T_c$, the relative dielectric constant $\epsilon_r$ and the dissipation factor $\tan\delta$, but which is also stable as regards degradation and exhibits a favorable reversibility of the polarization and microphonic stability.

According to the invention, this object is achieved in that the pyroelectric ceramic material has a composition which corresponds to the formula $Pb_{1-(x+0.5(x-y))}RE_xTi_{1-y}Mn_yO_3$, where RE is at least one rare earth metal and $0.04 \leq x \leq 0.20$ and $0.01 \leq y \leq 0.04$.

In accordance with an advantageous embodiment of the invention, La, Sm and/or Gd are used as the rare earth metals. In the experiments which have led to the present invention, it was surprisingly found that a pyroelectrically very effective ceramic material can be obtained when single-phase material in the form of lead titanate is used which is doped with at least one rare earth metal, preferably La, Sm and/or Gd, and with manganese. $\epsilon_r$ can be optimally minimized by using said manganese dopant in a quantity of preferably 2 at. % as a substituent for Ti sites.

Further advantages of the compositions according to the invention, which advantages relate in particular to the industrial scale manufacture of pyroelectric detectors, are that the ceramic molding can be sintered in a fracture-free manner and that, due to their relatively high Curie point, they can very suitably be processed into an SMD-component. In the compositions according to the invention, the relatively low values of the relative dielectric constant $\epsilon_r$ lead to very favorable Figures of Merit $F'_M$. A further advantage is that pyroelectric detectors on the basis of the material according to the invention exhibit a satisfactory microphonic stability. The ratio of the electromechanical coupling factors $k_p/k_t$ lies in the range from $<0.2$ for $PL_8M_2$ to $<0.1$ for $PS_8M_2$ (formulae given in Table 1). The abbreviation $k_p$ means "planar" coupling factor and corresponds to the coupling factor $k_{31}$ which is also used in literature; $k_t$ means "thickness" coupling factor and corresponds to the coupling factor $k_{33}$ which is also used in literature. To carry out measurements, $k_p$ and $k_t$ are most readily accessible; for this reason they are generally used in literature.

BRIEF DESCRIPTION OF THE DRAWINGS

The invention will be explained in greater detail by means of exemplary embodiments and with reference to the accompanying drawing, in which FIGURE 1 is a sectional view of a pyroelectric detector for infrared radiation.

DETAILED DESCRIPTION OF THE PREFERRED EMBODIMENT

FIGURE 1 shows a pyroelectric detector 1 for infrared radiation. Said detector comprises a detector element 1 of pyroelectric ceramics 2. Detector element 1 is provided with NiCr-electrodes 3, 4 on two sides. Electrode 3 is electrically connected to the surface 6 of the substrate 7 of the detector via contact wire 5. The detector further comprises a housing 8 which is supported by substrate 7 and which hermetically seals the detector element 1. The housing 8 has a window 9 which is transparent in the wavelength range to which detector element 1 is sensitive.

The detector element is supported by two supporting members 10 and 11 which are connected to electrode 3. The detector further comprises an electronic circuit (diagrammatically shown) which is accommodated in the housing 12. The circuit comprises a FET (field effect transistor) 13 and two diodes 14, 15. The substrate 7 is further provided with electrical connection members 16, 17, 18. Further details about this type of detector are described in GB-PS 2,164,789.

Within the scope of the invention, pyroelectric ceramic bodies having the following compositions were manufactured and processed into ceramic detector elements for the above-described pyroelectric detectors:

TABLE 1

| Sample | Composition |
| --- | --- |
| The samples were manufactured as follows: | |
| $PL_4M_2$ | $Pb_{0.95}La_{0.04}Ti_{0.98}Mn_{0.02}O_3$ |
| $PL_6M_1$ | $Pb_{0.915}La_{0.06}Ti_{0.99}Mn_{0.01}O_3$ |
| $PL_6M_2$ | $Pb_{0.92}La_{0.06}Ti_{0.98}Mn_{0.02}O_3$ |
| $PL_6M_3$ | $Pb_{0.925}La_{0.06}Ti_{0.97}Mn_{0.03}O_3$ |
| $PL_6M_4$ | $Pb_{0.93}La_{0.06}Ti_{0.96}Mn_{0.04}O_3$ |
| $PL_8M_2$ | $Pb_{0.89}La_{0.08}Ti_{0.98}Mn_{0.02}O_3$ |
| $PS_8M_2$ | $Pb_{0.89}Sm_{0.08}Ti_{0.98}Mn_{0.02}O_3$ |
| $PS_{12}M_2$ | $Pb_{0.83}Sm_{0.12}Ti_{0.98}Mn_{0.02}O_3$ |
| $PS_{15}M_2$ | $Pb_{0.785}Sm_{0.15}Ti_{0.98}Mn_{0.02}O_3$ |
| $PG_{10}M_2$ | $Pb_{0.86}Gd_{0.10}Ti_{0.98}Mn_{0.02}O_3$ |

Lead oxide (PbO), titanium oxide ($TiO_2$), manganese oxide ($Mn_2O_3$) and the oxides of the corresponding rare earth metals (RE) all analytical grade purity, were weighed-in in the proper quantities and mixed in an agate ball mill in an alcoholic suspension, preferably isopropanol. Subsequently, after drying at temperatures in the range from 900° C. to 1100° C., the mixtures were calcined in air for 10 hours. Preferably, the calcining operation was carried out in 2 steps: 8 hours at a temperature of 800° C. and subsequently, 10 hours at a temperature of 950° C.

After calcining, the powders are ground again in an agate ball mill in isopropanol for several hours until they are in a suitable condition to be sintered. First, the powders are mechanically pressed into prismatic bars at a pressure of 0.5 kbar, and then these bars are subjected to an isostatic cold-compression operation at a pressure of 3.5 kbar.

The pressed bars were subsequently sintered in platinum crucibles having detachable covers in an $O_2$ atmosphere at temperatures of 1260° C. for 4 hours. The typical densities of the ceramic bodies were approximately 97% to 98% of the theoretical density. The sintered bars were ground cylindrically to a diameter of 5 mm, cut into discs having a thickness of 0.1 and 0.3 mm and then lapped. To carry out electrical measurements, the discs were coated with avaporated Cr/Ni-Au-electrodes.

To polarize the electroded ceramic discs, said discs were tempered in an oil bath at a temperature of 150° C. while being exposed to a field of 70 kV/cm for five minutes and, after which they were cooled slowly under the influence of said field. The dielectric constants $\epsilon_r$ were measured at 1 kHz in a commercially available measuring bridge.

By way of example, a description is given of the manufacture of the sample having the composition $PS_{12}M_2$:

The prepared quantity of powder comprises a starting composition with a molar ratio of 1/3.

A quantity of 64.353 g of PbO, 5.812 g of $Sm_2O_3$, 26.101 g of $TiO_2$ and 0.5263 g of $Mn_2O_3$ are mixed in isopropanol in an agate ball mill.

After mixing, the slip is dried at a temperature of 80° C. to 100° C. and calcined in air in an aluminium oxide crucible having a detachable cover. Calcining is carried out at two different temperatures: for 8 hours at a temperature of 800° C. and, subsequently, for 10 hours at a temperature of 950° C.

The calcined product is ground in isopropanol in an agate ball mill. Subsequently, the slip is dried at a temperature of 80° C. to 100° C. and deaggregated in a mortar to form a loose powder.

The powder is pressed in a hand-driven screw press at a uniaxial pressure of approximately 500 bar into prismatic blocks having the dimensions 7×7×17 min. Subsequently, the pressed bodies are subjected to an isostatic cold-compressing process at a pressure of 3.5 kbar=0.35 MPa. The green density then amounts to 60% of the theoretical density.

The pressed prismatic blocks are sintered in platinum crucibles having a detachable cover in a flowing oxygen atmosphere for 4 hours at a temperature of 1260° C.

The sintered blocks are ground cylindrically to a diameter of 5 mm, sown cut into discs and lapped to a thickness of 150 μm. A thin bonding layer of Cr/Ni is coated with evaporated gold electrodes in the form of a 70 nm thick layer.

The samples are polarized in an oil bath at a temperature of 150° C. and a field strength of $7 \times 10^6$ V/m for 5 minutes. The samples are cooled under the influence of said field.

The polarization was determined by heating the samples and integrally measuring the electric charge by means of a commercially available electrometer. The measuring results are shown in the following Table 2:

TABLE 2

| Electrical Properties of Samples | | | | | |
|---|---|---|---|---|---|
| PL$_4$M$_2$ | 200 | 2.0 | 1.0 | >350 | 1.5 | ≈50 |
| PL$_6$M$_1$ | 231 | 2.2 | 0.95 | >350 | 1.5 | ≈50 |
| PL$_6$M$_2$ | 209 | 2.2 | 1.05 | >350 | 1.5 | ≈50 |
| PL$_6$M$_3$ | 203 | 2.2 | 1.08 | >350 | 1.5 | ≈60 |
| PL$_6$M$_4$ | 193 | 2.2 | 1.1 | >350 | 1.5 | ≈70 |
| PL$_8$M$_2$ | 220 | 2.35 | 1.07 | 338 | 1.5 | ≈50 |
| PS$_8$M$_2$ | 173 | 2.35 | 1.35 | 335 | 0.7 | ≈50 |
| PS$_{12}$M$_2$ | 246 | 4.15 | 1.69 | 282 | 1.1 | ≈29 |
| PS$_{15}$M$_2$ | 306 | 4.70 | 1.54 | 213 | 3.6 | ≈33 |

TABLE 2-continued

| Electrical Properties of Samples | | | | | |
|---|---|---|---|---|---|
| PG$_{10}$M$_2$ | 205 | 3.35 | 1.64 | 318 | 0.8 | ≈35 |

We claim:

1. A radiation detector comprising a housing, a window in said housing which is transparent to the radiation to be detected and a radiation detecting element of pyroelectric ceramic material on the basis of lead titanate, wherein the composition of the ceramic material corresponds to the formula $$Pb_{1-(x+0.5(x-y))}RE_xTi_{1-y}Mn_yO_3,$$

where RE is at least one rare earth metal and $0.04 \leq x \leq 0.20$ and $0.01 \leq y \leq 0.04$.

2. The radiation detector as claimed in claim 1, wherein at least one of La, Sm and Gd is used as the rare earth metal.

3. The radiation detector as claimed in claim 1 wherein y=0.02.

4. The radiation detector as claimed in claim 1 wherein the composition corresponds to the formula $$Pb_{1-(x+0.5(x-0.02))}La_xTi_{0.98}Mn_{0.02}O_3,$$

where $0.04 \leq x \leq 0.08$.

5. The radiation detector as claimed in claim 1 wherein the composition thereof corresponds to the formula $$Pb_{1-(x+0.5(x-0.02))}Sm_xTi_{0.98}Mn_{0.02}O_3,$$

where $0.08 \leq x \leq 0.15$.

6. The radiation detector as claimed in claim 1 wherein the composition corresponds to the formula $$Pb_{0.86}Gd_{0.10}Ti_{0.98}Mn_{0.02}O_3.$$

* * * * *